United States Patent [19]

Hayashi

[11] Patent Number: 5,463,637
[45] Date of Patent: Oct. 31, 1995

[54] APPARATUS AND METHOD FOR TESTING A BUFFER MEMORY DEVICE WHICH CHECKS WHETHER DATA IS VALID OR INVALID

[75] Inventor: Ryotaro Hayashi, Yokohama, Japan

[73] Assignee: Fujitsu Limited, Kawasaki, Japan

[21] Appl. No.: 174,015

[22] Filed: Dec. 28, 1993

[30] Foreign Application Priority Data

Dec. 28, 1992 [JP] Japan ................................. 4-348586

[51] Int. Cl.⁶ ................................................. G11C 29/00
[52] U.S. Cl. ...................... 371/21.1; 371/21.2; 371/25.1; 364/579; 364/580
[58] Field of Search ................... 371/21.1, 21.2, 371/21.3, 22.5, 19, 25.1; 364/579, 580

[56] References Cited

U.S. PATENT DOCUMENTS

| | | | |
|---|---|---|---|
| 5,022,028 | 6/1991 | Edmonds et al. | 371/19 |
| 5,218,605 | 6/1993 | Low et al. | 371/19 |

Primary Examiner—Emanuel T. Voeltz
Assistant Examiner—Kamini Shah
Attorney, Agent, or Firm—Fujitsu Limited

[57] ABSTRACT

A method and a device for invalidating data stored in a buffer memory of a system equipped with a high-speed buffer memory which stores a copy of data stored in a main memory. The invalidation of the data stored in the buffer memory for commands can be tested even where there exists a buffer memory for commands and a buffer memory for operands independent of each other. A testing unit stores a sequence of recurring commands in a storage region of the main memory, holds a copy of the sequence of recurring commands in a storage region of the buffer memory, and takes out a sequence of successive processing commands from a processing unit to substitute it for the sequence of recurring commands in the storage region of the main memory. The storage region of the buffer memory is invalidated by an invalidation unit, the processing unit 1 executes the processing directed to the storage region, and whether the invalidation is correctly effected or not is judged based upon the content of execution.

16 Claims, 11 Drawing Sheets

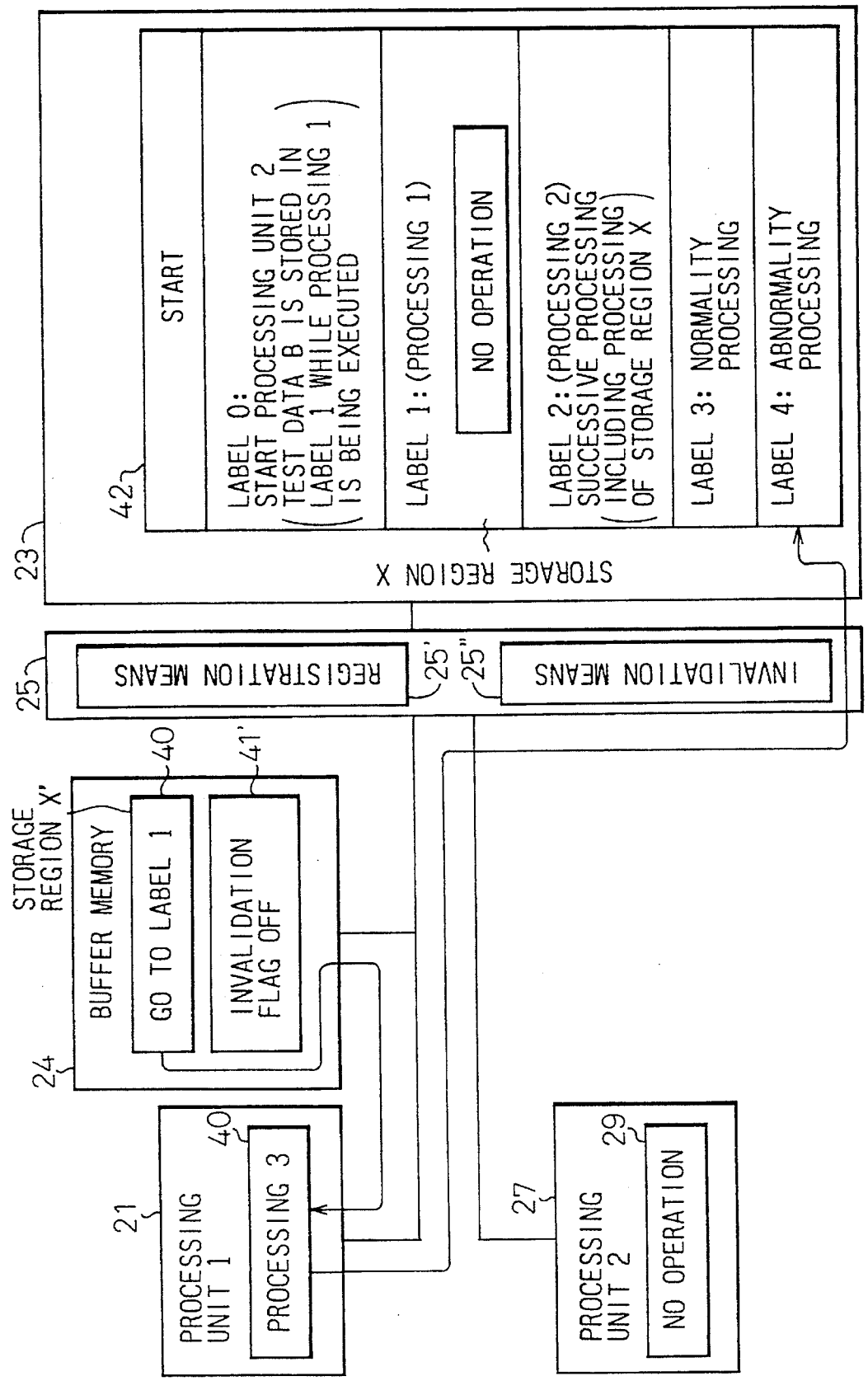

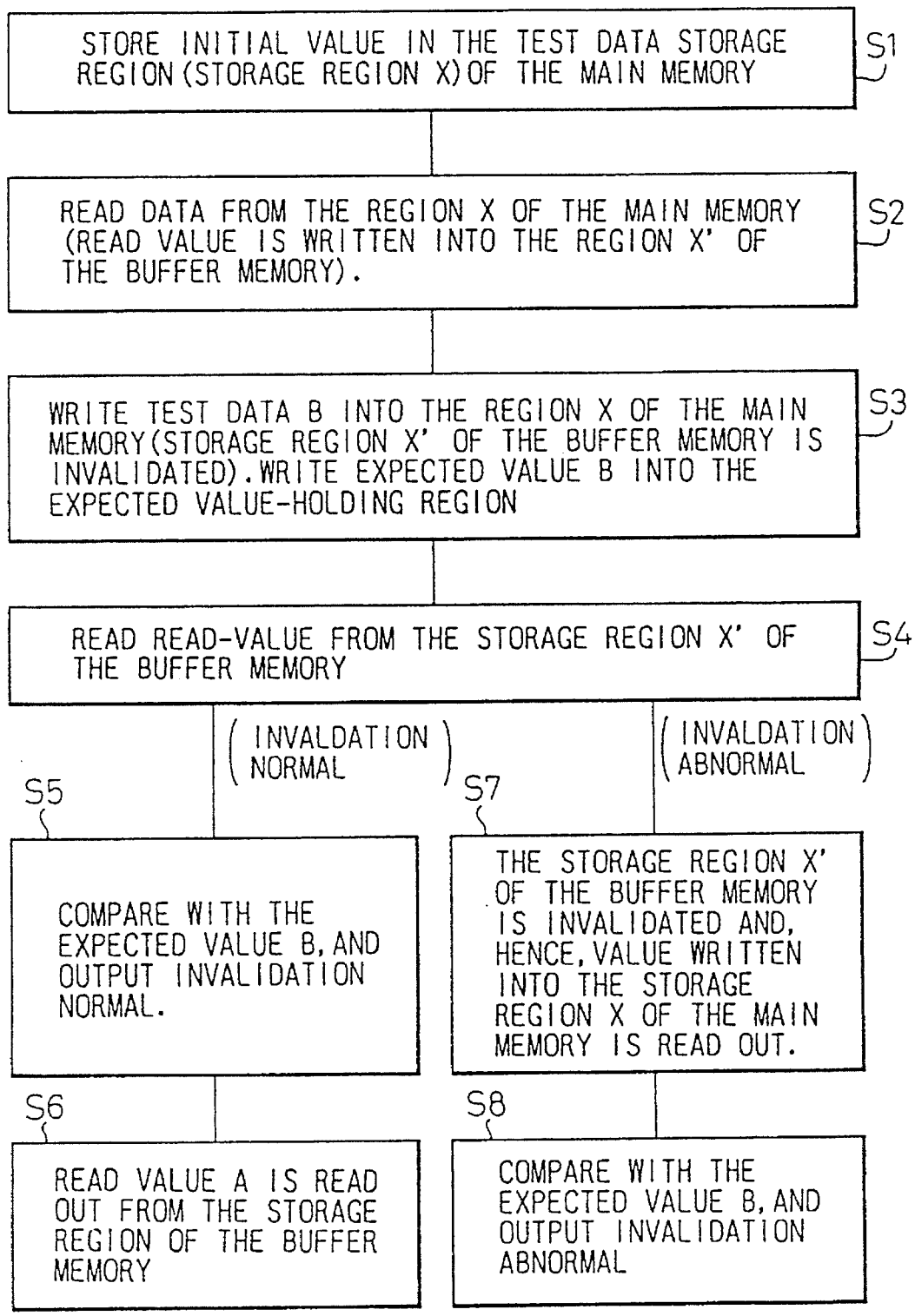

APPARATUS AND METHOD FOR TESTING A BUFFER MEMORY DEVICE WHICH CHECKS WHETHER DATA IS VALID OR INVALID

BACKGROUND OF THE INVENTION

1. Field of the Invention

The present invention relates to a device and a method for testing a buffer memory which stores a copy of data stored in a main memory and processes the data at a high speed, in place of the main memory, upon receiving a request from a CPU.

2. Description of the Related Art

In a conventional system having a buffer memory, when data in a main memory is rewritten by another device different from the device connected to the buffer memory, the data in a storage region of the buffer memory corresponding to a storage region in the main memory is invalidated. The above buffer memory requires a test for checking whether the data is invalid or not.

FIG. 9 illustrates a concrete example of a conventional method of testing the invalidity of the data in the buffer memory and FIG. 10 illustrates another concrete example of a conventional method of testing the invalidity of the data in the buffer memory.

In these drawings, reference numeral 100 denotes a processing unit 1 which is, for example, a CPU, reference numeral 101 denotes a processing unit 2 which is an I/O unit such as a disk unit, 102 denotes a main memory which stores a test program for testing the invalidity of the data in the buffer memory, and reference numeral 103 denotes a buffer memory which copies and holds part of the content of the main memory.

In the main memory 102, reference numeral 110 denotes a test data storage region (storage region X of the region) where an initial value A will be stored.

Reference numeral 111 denotes an expected-value-holding region where there will be stored an expected value that is to be compared with the result of testing the invalidity of the data in the buffer memory 103. Reference numeral 112 denotes a read value comparator means which, after the test data are stored in the test data storage region (storage region X), reads the data of the corresponding storage region X' of the buffer memory and compares them to determine whether the data invalidation is normally carried out or not.

FIG. 9(A) illustrates the initialization step when the test data (initial value A) is stored in the predetermined storage region 110 from the processing device 2 (101). In this state, the separately prepared test data (i.e. the initial value A) is read from the processing unit 1 (100), and the initial value A is read as a read value A and written into the predetermined storage region X' of the buffer memory 103 (which corresponds to the test data storage region 110 (storage region X) of the main memory 102).

FIG. 9 (B) illustrates the writing of test data.

A write value B of the test data is written into the test data storage region 110. At the same time, an expected value B is written into the expected value-holding region 111. As the write data B is written by the processing unit 2 (101) into the test data storage region 110, the storage region X' of the buffer memory 103 is invalidated by a memory control unit (not shown).

FIG. 9 (C) illustrates the case where the data stored in the buffer memory 103 is precisely invalidated.

The read value comparator means 112 takes out the expected value B from the expected value-holding region 111, takes out the read value B from the storage region X' of the buffer memory 103, and compares them. A correct result of comparison is output.

FIG. 9 (D) illustrates the case where the data stored in the buffer memory is not precisely invalidated (failure of the data invalidation).

The read value comparator means 112 takes out the expected value B from the expected value-holding region 111, takes out the read value A from the storage region X' of the buffer memory 103, and compares them. A result of comparison indicating the failure of the data invalidation is output.

FIG. 10 is a flow chart illustrating a conventional method of testing the data-invalidation of the buffer memory.

The flow will now be explained according to the numbers representing the steps of the drawing.

S1 The processing unit 1 (100) takes out the test data from the processing unit 2 (101), and stores the initial value A in the test data storage region (storage region X) of the main memory 102 (see FIG. 9(A)).

S2 The processing unit 1 (100) reads the initial value A from the test data storage region 110 of the main memory 102. As a result, the read value A is written into the storage region X' of the buffer memory (see FIG. 9(A)).

S3 The processing unit 1 (100) takes out the write value B from the processing unit 2 (101) and writes the test data B (write value B) into the test data storage region (storage region X) 110 of the main memory (see FIG. 9 (B)). As a result, the data stored in the buffer storage region X' is invalidated by the memory control unit (not shown). Moreover, the processing unit 1 (100) writes the expected value B into the expected value-holding region 111 (see FIG. 9 (B)).

S4 The processing unit 1 (1001) reads the read value from the storage region X' of the buffer memory device 103.

S5 When the data stored in the storage region X' of the buffer memory 103, has been correctly invalidated, since the data stored in the storage region X' (113) of the buffer memory has also been invalidated, the processing unit 1 (100) reads the write value B from the storage region X of the main memory 102 (see FIG. 9(C)).

S6 The read value comparator means 112 compares the expected value B of the expected value-holding unit 111 with the write value B read out from the storage region X, and outputs data showing that the stored data therein are correctly invalidated invalidation normal since they are identical to each other (see FIG. 9 (C)).

S7 When the data stored in the buffer memory 103 is not correctly invalidated (failure of data invalidation), the processing unit 1 (100) reads the read value A from the storage region X' (113) of the buffer memory 103.

S8 The read value comparator means 112 compares the read value A read out from the storage region X' of the buffer memory 103 with the expected value B in the expected value-holding region 111, and judges that the invalidation of the data stored in the buffer memory 103 is incorrectly carried out, since they are not in coincided with each other (see FIG. 9 (D)).

In the conventional test for checking the invalidation of the buffer memory, means was necessary for holding the expected value and for comparing the read value with the expected value. In the case of the system in which the buffer memory for commands and the buffer memory for operands exist independently of each other, it is difficult to read out the content of the buffer for commands. Therefore, a method to estimate whether data is read out from the buffer memory for commands, or the main memory data is read out from the main memory, utilizing only the result of the execution of the command, was available. Therefore, it has been virtually impossible to check the invalidity of data stored in the buffer memory for commands. Furthermore, the device of the prior art was complex and bulky and required an extended period of processing time.

SUMMARY OF THE INVENTION

The object of the present invention is to provide a device for testing the invalidation of the data stored in the buffer memory which is capable of checking the invalidation of the data stored in the buffer memory for commands, even in the device a buffer memory for commands and a buffer memory for operation, exist, independently, without requiring means for comparing an expected value with a read value, and a method of executing the testing at high speeds using the simply fabricated device, overcoming the problems inherent in the aforementioned prior art.

In order to accomplish the above-mentioned object, the present invention provides a device for testing a buffer memory which basically employs the technical constitution, and a method of testing, described below.

That is, according to a first embodiment of the present invention, there is provided a device for testing a buffer memory comprising:

- a main memory storing predetermined operational processing data;
- a buffer memory for holding a copy of said predetermined operational processing data stored in said main memory;
- at least one processing unit which is capable of making access to at least either one of said main memory or said buffer memory; and
- an invalidation means which, when said processing unit is operated, causes said operational processing data in said main memory to be rewritten into different operational processing data and, when said operational processing data stored in said buffer memory are different from said operational processing data stored in said main memory, invalidates said operational processing data stored in said buffer memory;
- wherein said testing device is provided with a testing means stored in said main memory, said testing means having:
- a function for storing a separately provided first command sequence in a data storage region of said main memory and, at the same time, storing said first command sequence also in a data storage region of said buffer memory in response to an instruction from said processing unit;
- a function for storing a separately provided second command sequence different from said first command sequence in said data storage region of said main memory to substitute for said first command sequence in response to an instruction from a processing unit which is the same as or is different from said processing unit;
- a function for invalidating the first command sequence stored in the data storage region of said buffer memory when said first command sequence in said data storage region of said main memory is rewritten; and
- a function for judging that the invalidation processing is normally executed when said processing unit is executing said second command sequence after said invalidation processing has been executed and judging that said invalidation processing is not normally executed when said processing unit is executing said first command sequence.

According to a second embodiment of the present invention, furthermore, there is provided a device for testing a buffer memory comprising:

- a main memory storing predetermined operational processing data;
- a buffer memory for holding a copy of said predetermined operational processing data stored in said main memory;
- at least one processing unit which is capable of making access to at least either one of said main memory or said buffer memory; and
- an invalidation means which, when said processing unit is operated, causes said operational processing data in said main memory to be rewritten into different operational processing data and, when said operational processing data stored in said buffer memory are different from said operational processing data stored in said main memory, invalidates said operational processing data stored in said buffer memory;
- wherein said testing device is provided with a testing means stored in said main memory, and wherein a method of testing the buffer memory comprises:
- a step for storing a separately provided first command sequence in a data storage region of said main memory and, at the same time, storing said first command sequence also in a data storage region of said buffer memory in response to an instruction from said processing unit;
- a step for storing a separately provided second command sequence different from said first command sequence in said data storage region of said main memory to substitute for said first command sequence in response to an instruction from a processing unit which is the same as or is different from said processing unit;
- a step for invalidating the first command sequence stored in the data storage region of said buffer memory when said first command sequence in said data storage region of said main memory is rewritten; and
- a step for judging that the invalidation processing is normally executed when said processing unit is executing said second command sequence after said invalidation processing has been executed and judging that said invalidation processing is not normally executed when said processing unit is executing said first command sequence.

BRIEF DESCRIPTION OF THE DRAWINGS

FIG. 7 is a diagram illustrating the method of testing the invalidation of the buffer memory of the present invention;

FIG. 10 is a flow chart illustrating the conventional method of testing the invalidation of the buffer memory.

DETAILED DESCRIPTION OF THE PREFERRED EMBODIMENTS

Embodiments of a device and a method of testing the buffer memory of the present invention will now be described in detail with reference to the drawings.

Figure 1:
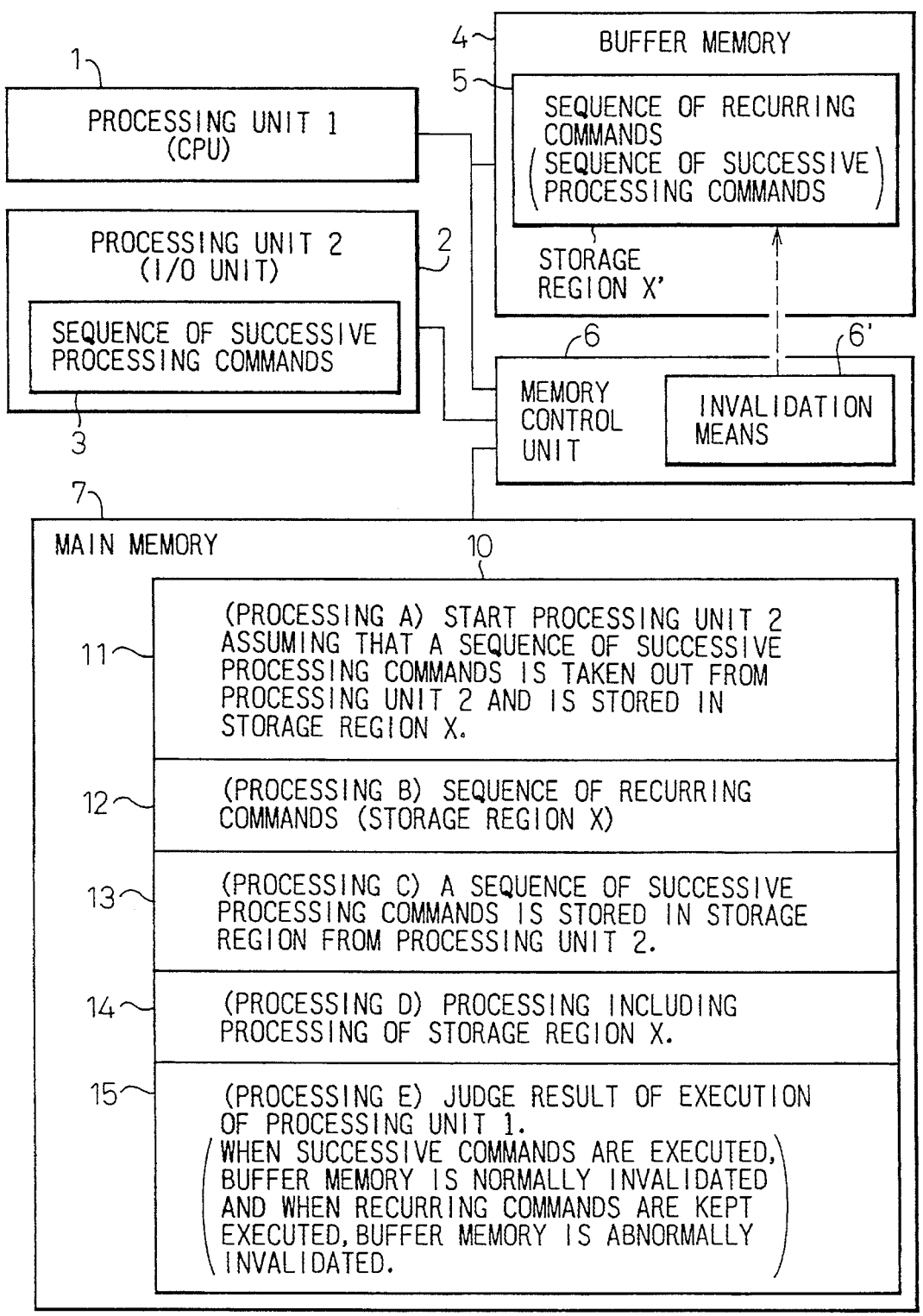
FIG. 1 is a diagram illustrating a basic constitution of the present invention.

FIG. 1 is a block diagram illustrating the constitution of a device for testing the buffer memory according to an embodiment of the present invention. That is, FIG. 1 illustrates a device for testing a buffer memory 4 comprising:

a main memory 7 storing predetermined operational processing data (processing A to processing E);

a buffer memory 4 for holding a copy of at least part of said predetermined operational processing data (processing A to processing E) stored in said main memory 7;

at least one processing unit 1 or 2 which is capable of making access to at least either one of said main memory 7 or said buffer memory 4; and an invalidation means 6' which, when said processing unit 1 or 2 is operated, causes said operational processing data in said main memory 7 to be rewritten into different operational processing data and, when said operational processing data stored in said buffer memory 4 are different from said operational processing data stored in said main memory 7, invalidates said operational processing data stored in said buffer memory 4;

wherein said testing device is provided with a testing means 10 stored in said main memory 7, said testing means 10 having:

a function for storing a separately provided first command sequence in a data storage region X of said main memory 7 and, at the same time, storing said first command sequence also in a data storage region X' of said buffer memory 4 in response to an instruction from said processing unit 1 or 2;

a function for storing a separately provided second command sequence different from said first command sequence in said data storage region X of said main memory 7 to substitute for said first command sequence in response to an instruction from a processing unit the same as or different from said processing unit 1 or 2, such as from said processing unit 1 or 2;

an invalidation means 6' for invalidating the first command sequence stored in the data storage region X' of said buffer memory 4 when said first command sequence in said data storage region X of said main memory 7 is rewritten; and a function for determining that the invalidation processing is correctly executed when said processing unit is executing said second command sequence after said invalidation processing has been executed and judging that said invalidation processing is not normally executed when said processing unit is executing said first command sequence.

According to the present invention, in a state where the first command sequence is stored in the storage region X of the main memory 7, by using the first processing unit 1 and a copy of the same command sequence as said first command sequence is held in the storage region X' of the buffer memory 4, the second processing unit 2 is operated to read the separately prepared second command sequence different from the first command sequence and to store it in the storage region X of the main memory 7 and, then, the storage region X' of the buffer memory 4 is invalidated after the first command sequence is substituted by the second command sequence. Thereafter, the processing is executed for the storage region X. Here, when the second command sequence is being executed, it is so determined that the data stored in the buffer memory 7 is correctly invalidated, and when the first command sequence is being executed, it is so determined that the data stored in the buffer memory 4 is not correctly invalidated.

The device for testing the buffer memory according to the present invention shown in FIG. 1 will be described in further detail. Reference numeral 1 denotes the first processing unit, such as a CPU, having operational functions and capable of making access to the predetermined memories, i.e., to both of the main memory 7 and the buffer memory 4.

Reference numeral 2 denotes the second processing unit constituted by an I/O device such as a disk unit and having a function capable of making access to at least the main memory 7.

In the above-mentioned embodiment, furthermore, the processing units are provided in a plural number such as first and second processing units. In this case, each of them have the aforementioned functions.

That is, in a group of processing units used in the present invention, it is desired that each of the processing units has a function of executing the processing of a command sequence which is different from those executed by other processing units and out of synchronism from other processing units.

That is, the second processing unit 2 operates out of synchronism with the operational processing executed by the first processing unit 1. Even when a certain command is given to the first processing unit 1, the first processing unit 1 does not immediately operate, and the execution of a predetermined command is finished after a predetermined period of time has passed.

In the present invention, furthermore, the first processing unit 1 and the second processing unit 2 may be the same processing unit. In this case, it is desired that the commands which are different from each other are processed out of synchronism with each other.

In the present invention, it is desired that the command sequence that is stored first in the main memory 7 by the first processing unit 1 is different from the command sequence that is then stored in the main memory 7 by the first processing unit 1 or the second processing unit 2.

Here, the command sequence stored first in the main storage unit 7 by the first processing unit 1 is defined to be a first command sequence, and the command sequence stored thereafter in the main memory 7 by the first processing unit 1 or the second processing unit 2 is defined to be a second command sequence.

In a preferred constitution of the device for testing the buffer memory according to the embodiment of the invention shown in FIG. 1, the first processing unit 1 is allowed to make access to both the main memory 7 and the buffer memory 4, and the second processing unit 2 is allowed to make access to the main memory 7.

The first command sequence which constitutes operational processing data stored first in the data storage region X of the main memory 7 by the first processing unit 1 must be a sequence of recurring commands, and the second command sequence which is stored in the data storage region X of the main memory 7 where the first command sequence is stored to substitute for said first command sequence must be different from said first command sequence or said sequence of recurring commands and may be, for example, a sequence of successive processing commands.

In the second processing unit 2, reference numeral 3 denotes test data or a sequence of successive processing commands which is the second command sequence (e.g., NO OPERATION (command for no operation), etc.)). Reference numeral 4 denotes a buffer memory in which reference numeral 5 denotes test data or a sequence of recurring commands which is the first command sequence (e.g., GO TO command that designates its own label). Reference numeral 6 denotes a memory control unit which controls the input to the main memory 7, controls the invalidation of the data stored in the buffer memory 4, and adjusts the order of accesses when accesses are made to the main memory 7 from the plurality of processing units. Reference numeral 6' denotes an invalidation means which invalidates the data stored in the storage region specified in the buffer memory 4. Reference numeral 7 denotes the main memory having a region for storing programs of the testing means, and wherein reference numeral 10 denotes the testing means. Here, the invalidation means 6' needs not necessarily be provided inside the memory control means 6 but may be provided at a suitable portion.

In the testing means 10, reference numeral 11 denotes a process A for starting the second processing unit 2, and 12 denotes a process B for processing the sequence of recurring commands which is the first command sequence. The process B is stored in the storage region X. Reference numeral 13 denotes a process C by which the sequence of successive processing commands which is the second command sequence is stored in the storage region X from the second processing unit 2 that is started by the process A. Reference numeral 14 denotes a process D which includes the processing of the storage region X, and 15 denotes a process E for judging the result of execution of the first processing unit 1.

Described below is the method of testing the invalidation of the data stored in the buffer memory using the device of the present invention shown in FIG. 1 in accordance with the operation thereof and, particularly, in accordance with the processing procedure of the testing means 10.

First, in order to start a predetermined operational processing, the first processing unit 1 tries to read a sequence of recurring commands which is the first command sequence stored in the data storage region X of the main memory 7 and starts the predetermined operational processing according to the sequence of recurring commands. At the same time, the sequence of recurring commands which is the first command sequence read from the first processing unit 1 is also stored in the data storage region X' of the buffer memory 4. In the subsequent operational processing, therefore, the first processing unit 1 does not need to try to read the sequence of the recurring commands in the main memory 7 but is allowed to read the sequence of recurring commands constituting the operational processing data by making access to the data storage region X' of the buffer memory 4 which is disposed near to it.

The above operation will be described in further detail.

The first processing unit 1 starts the second processing unit 2, which has a function for taking out separately provided successive processing commands and for storing them in the storage region X of the main memory 7 (process A).

The first processing unit 1 executes the recurring commands which are stored in the storage region X of the main memory 7 (process B). In response, for example, to the GO TO command, the recurring command designates its own label and recurs. The first time, the first processing unit 1 executes the sequence of recurring commands in the storage region X of the main memory 7. The sequence of recurring commands is executed one time and is read into the storage region X' of the buffer memory (test data 5 (sequence of recurring commands)). After the second and subsequent times, the sequence of recurring commands in the storage region X' of the buffer memory is executed (process B).

After the sequence of recurring commands is taken in by the buffer memory 4, the test data 3 (sequence of successive processing commands such as NO OPERATION, etc.) are taken out from the second processing unit 2 and are stored in the storage region X of the main memory 7 (process C). As a result, the data stored in the data storage region X of the main memory 7 become different from the data stored in the data storage region X' of the buffer memory 4, and the invalidation means 6' invalidates the data stored in the storage region X' of the buffer memory 4.

Next, the processing including the processing of the storage region X is executed (process D). In this case, when the invalidation is correctly effected, the first processing unit 1 does not execute the command sequence of that region since the data stored in the storage region X' of the buffer memory 4 that corresponds to the storage region X, has been invalidated, but tries to read the substituted command sequence (NO OPERATION, etc.) in the storage region X of the main memory 7 and executes this command sequence. When the invalidation of data is not correctly effected, the first processing unit 1 executes the sequence of recurring commands in the storage region X' of the buffer memory 4 that corresponds to the storage region X.

The result of the process D executed by the first processing unit 1 is determined (process E). That is, when the data invalidation is correctly effected, the first processing unit 1 executes the sequence of successive commands (NO OPERATION, etc.) in the process which is directed for the storage region X. Based upon the result of the process D (constituted by the sequence of successive processing commands), therefore, it can be judged whether the data stored in the buffer memory 4, is correctly invalidated or not. When the data stored in the buffer memory is not correctly invalidated, the first processing unit 1 executes the sequence of recurring commands in the storage region X' of the buffer memory 4, from which it can be determined that the data stored in the buffer memory 4 is not normally invalidated. Here, the content processed by the first processing unit 1 (1) can be determined by employing such a timer process that the execution of the sequence of recurring commands is finished after it recurs for a predetermined period of time.

According to the present invention, it is possible to test the invalidation of the data stored in the buffer memory region for commands in a system in which the buffer memory for commands and the buffer memory for operands exist independently of each other. Unlike the prior art, therefore, no means is required for holding an expected value and for comparing the expected value with a read value, making it possible to efficiently test the invalidation of the data stored in the buffer memory.

Figure 2:
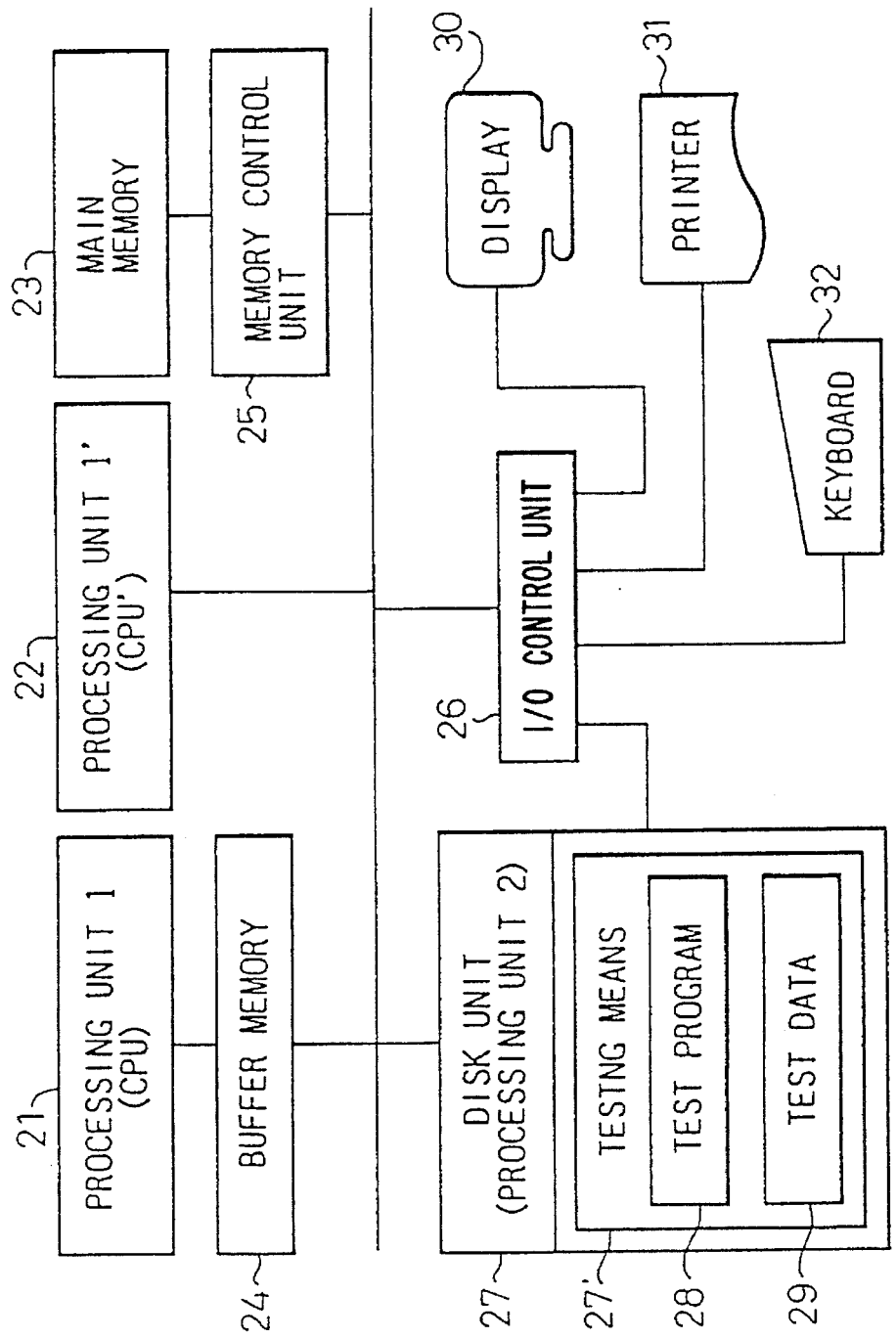
FIG. 2 is a diagram illustrating the constitution of a system according to an embodiment of the present invention.

FIG. 2 illustrates the constitution of a system according to an embodiment of the present invention.

In FIG. 2, reference numeral 21 denotes a first processing unit 1 (CPU 1) equipped with a buffer memory 24. Reference numeral 22 denotes another first processing unit 1' (CPU' 1) which is not equipped with the buffer memory 24. Reference numeral 23 denotes a main memory which takes out a test program 28 from a disk unit 27 and stores it in the data storage region X of the above-mentioned main memory. Reference numeral 25 denotes a memory control unit, 26 denotes an input/output control unit which controls an input to and an output from the disk unit 27 and the like units, and 27 denotes the disk unit (second processing unit 2) equipped with a testing means 27' which is stored in a magnetic disk or the like. Reference numeral 27' denotes the testing means stored in the magnetic disk or the like, reference numerals 28 and 29 denote a test program and a test data of the testing means 27', reference numeral 30 denotes a display, 31 a printer, and 32 denotes a keyboard.

FIGS. 3, 4, 5, 6 and 7 are diagrams illustrating the method of testing the invalidation of the data stored in the buffer memory according to the present invention.

In these drawings, reference numeral 21 denotes the first processing unit (1) for testing the invalidation, 23 denotes the main memory, 24 denotes the buffer memory, 25 the memory control unit, and 25' a registration means for storing a copy of data stored in the main memory 23 into a specified region of the buffer memory 24. Reference numeral 25" denotes an invalidation means for invalidating the data in the specified region of the buffer memory 24, and reference numeral 27 denotes the second processing unit (2) which loads the main memory 23 with the testing means 27' that is stored in the magnetic disk unit. In the second processing device (2) 27, reference numeral 27' denotes the testing means stored in the magnetic disk or the like, 29 denotes test data B which is a no-operation command (NO OPERATION) used as a sequence of successive processing commands in the testing means 27', reference numeral 29' denotes test data A (GO TO LABEL 1) used as a sequence of recurring commands, 40 denotes a pointer that indicates the processing position of a test program 42 processed by the first processing unit (1) 21, reference numeral 41 denotes the storage region X of the buffer memory, and 42 denotes the test program (testing means) stored in the main memory 23.

In the test program 42, a LABEL 0 is to start the second processing unit (2) 27. Even when started, the second processing unit (2) 27 does not immediately commence the writing operation. While the processing 1 of a subsequent LABEL 1 is being executed, the test data B (29) is taken out from the second processing unit (2) 27 and the storage region X is rewritten into the test data B (29).

The LABEL 1 is a process 1 for processing test data A (29')(GO TO LABEL 1 in the drawings) or a test data B (29) (NO OPERATION) in the sequence of recurring commands. The sequence of recurring commands (GO TO LABEL 1) proceeds to a LABEL 4 after the passage of a time set by the timer. The storage region of the LABEL 1 in the main storage unit 23 is denoted by X.

A LABEL 2 is a process 2 and is a unit for taking out the test data B (29) (NO OPERATION) from the processing unit 2.

A LABEL 3 is a process 3 and successively executes the process (process 1) in the storage region X.

The LABEL 3 is the process when the buffer memory 24 is normally invalidated.

A LABEL 4 is a process when the buffer memory 24 is abnormally invalidated.

Figure 3:
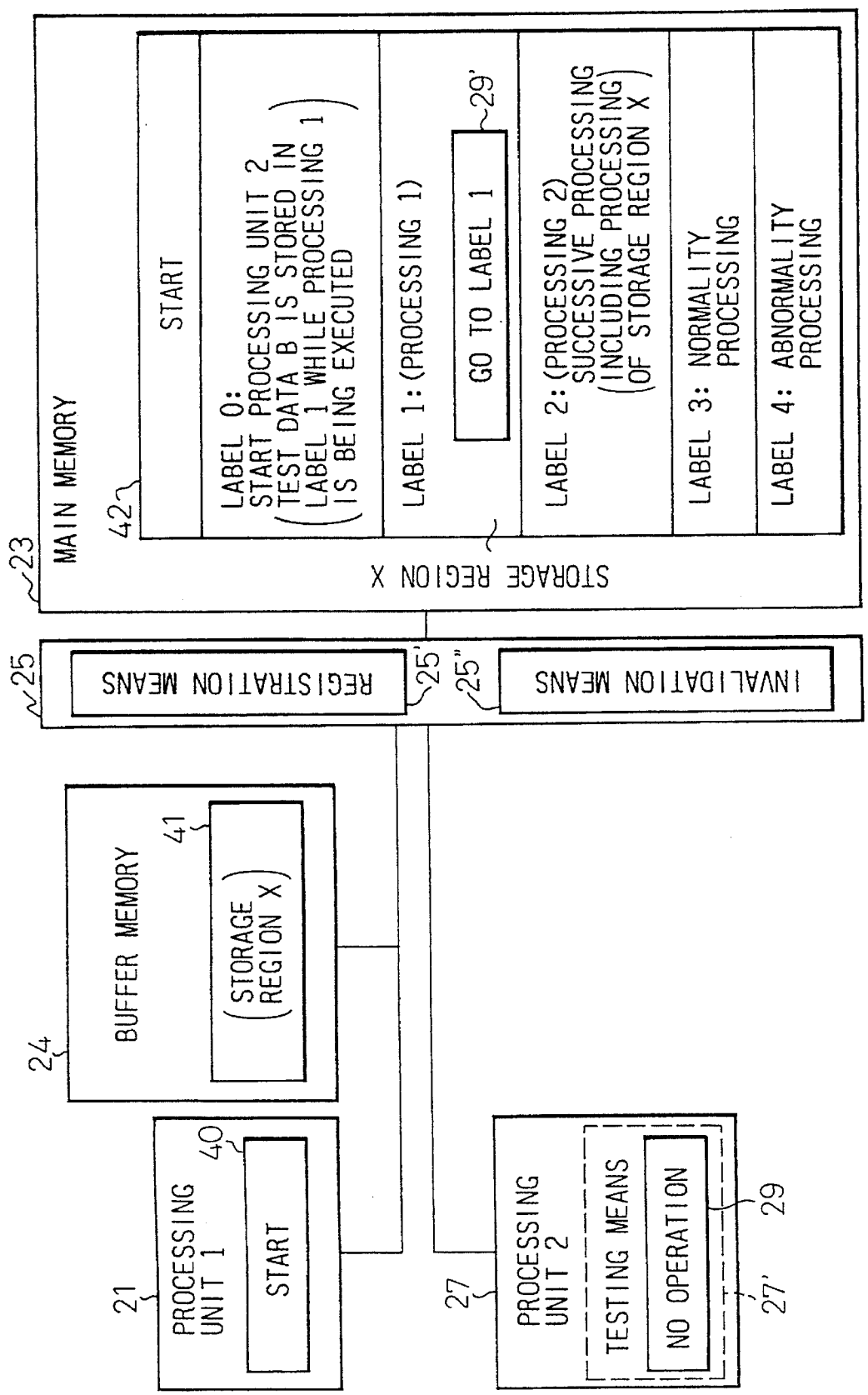
FIG. 3 is a diagram illustrating a method of testing the invalidation of a buffer memory of the present invention.

FIG. 3 illustrates the process for initializing the testing.

To the first processing unit (1) 21 is set a pointer that indicates the start position of the test program 42. The test program 42 is started and the second processing unit (2) 27 is started with the LABEL 0. The test data B (29) is not immediately read out even when the second processing unit (2) 27 is started, and the process is shifted to the LABEL 1 (process 1).

Figure 4:
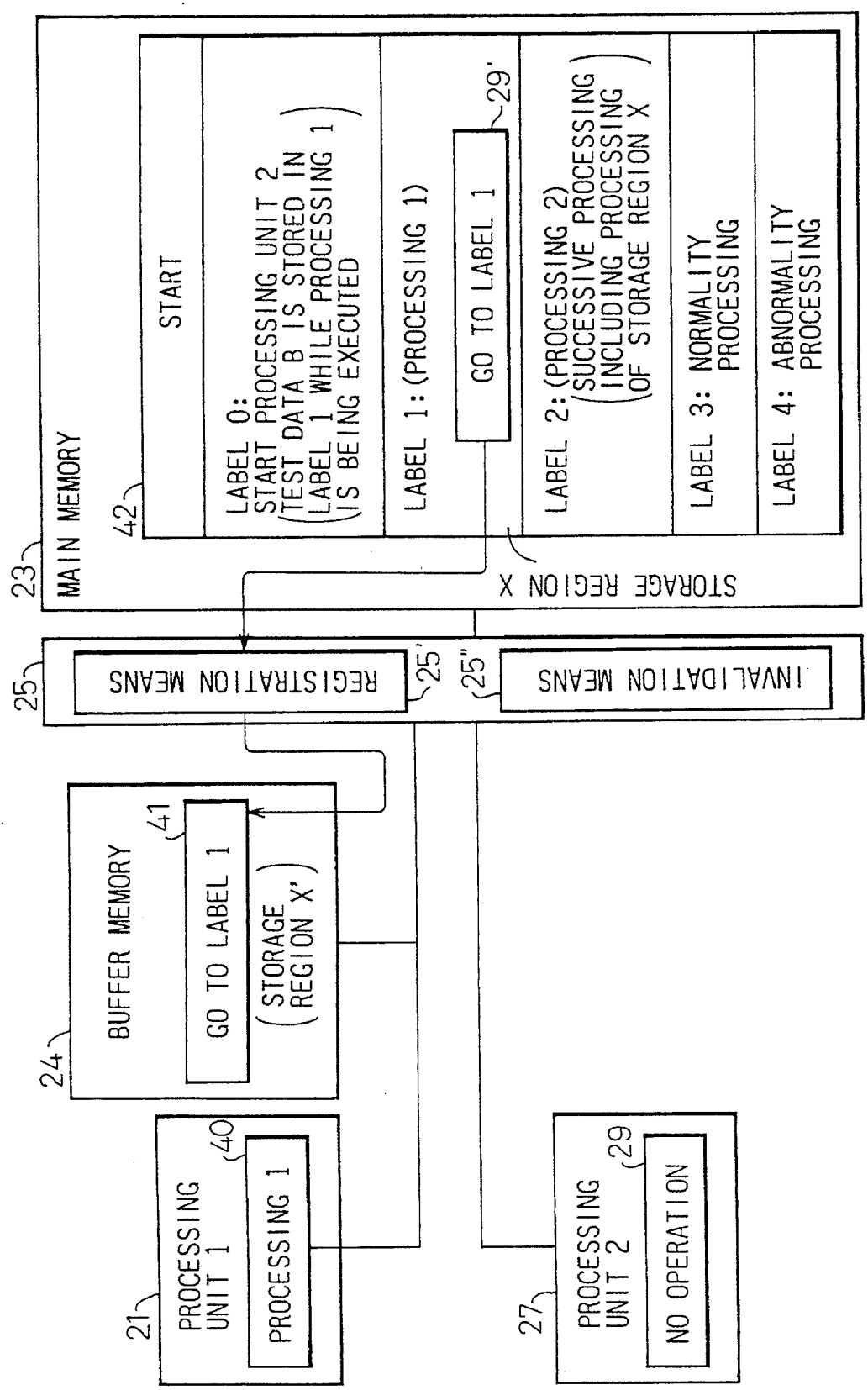
FIG. 4 is a diagram illustrating the method of testing the invalidation of a buffer memory of the present invention.

FIG. 4 is a diagram illustrating a process of registration to the buffer memory 24.

When the LABEL 1 (process 1) is executed by the first processing unit (1) 21, the recurring processing of the first time executes the test data A (29') (GO TO LABEL 1) in the storage region X of the main memory 23. After the second and subsequent times, the sequence of recurring commands (GO TO LABEL 1) in the storage region X is read by the registration means 25' into the storage region X' of the buffer memory 24, and the process 1 is executed by the first processing unit (1) 21 in compliance with the sequence of recurring commands (GO TO LABEL 1) 41 of the buffer memory 24.

Figure 5:
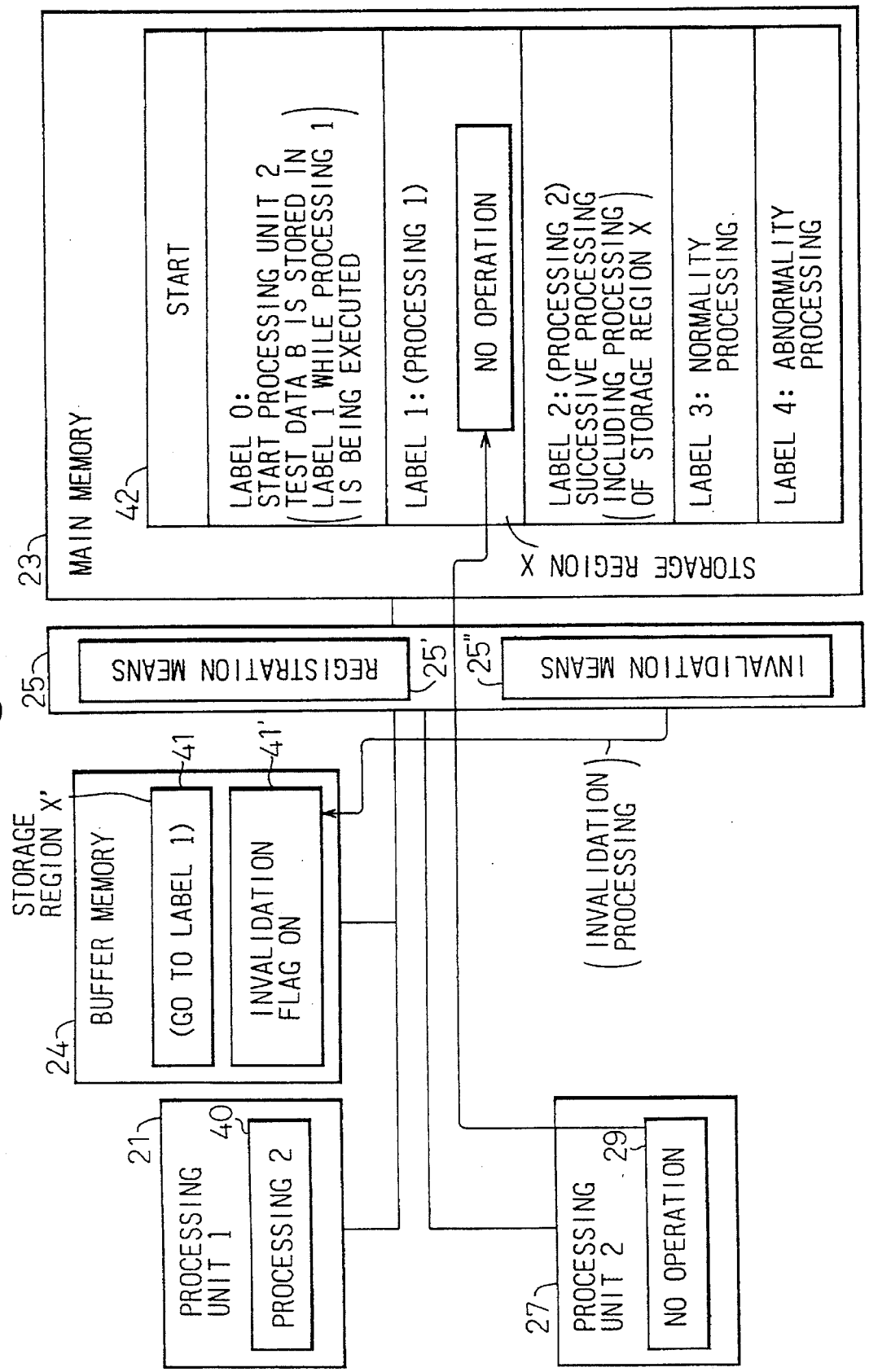
FIG. 5 is a diagram illustrating the method of testing the invalidation of the buffer memory of the present invention.

FIG. 5 illustrates the invalidation of the buffer memory 24.

In FIG. 5, reference numeral 41' denotes a flag for invalidating the data stored in the storage region X' of the buffer memory 24.

As the second processing unit (2) 27 is started with the LABEL 0 while the process 1 is being executed, the test data B (29) (NO OPERATION) is stored in the LABEL 1, and the test data B (29) (NO OPERATION) is substituted for the storage region X. The invalidation means 25" turns on the flag of invalidating the data stored in the storage region X' of the buffer memory 24 and invalidates the data in the storage region X'. When the invalidation is not correctly effected, the flag of invalidation remains turned off.

Figure 6:
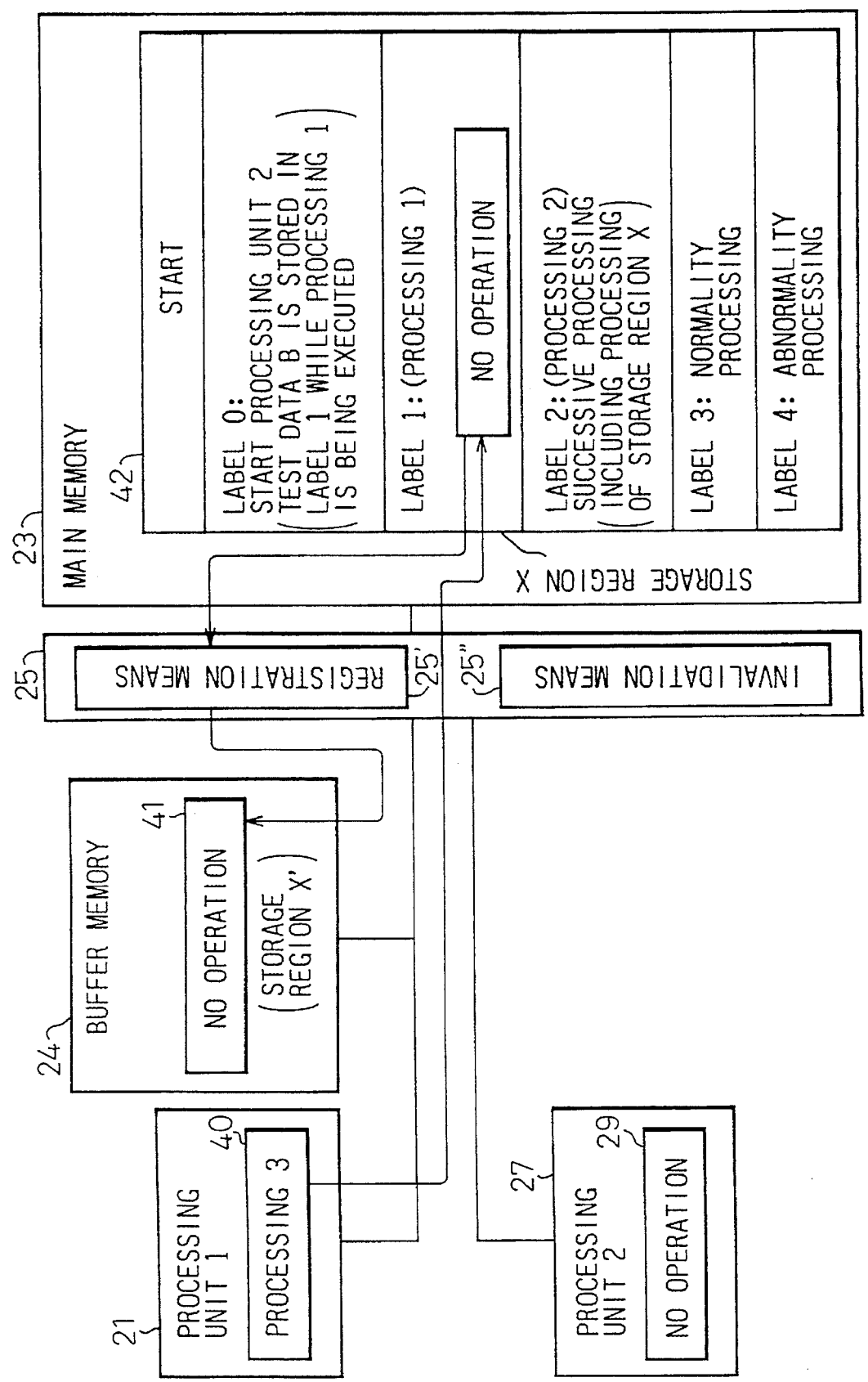
FIG. 6 is a diagram illustrating the method of testing the invalidation of the buffer memory of the present invention.

FIG. 6 illustrates the case where the invalidation is correctly effected. After the processing of the LABEL 2 is finished, the process 3 for the LABEL 3 is started. The process 3 executes the sequence of successive processing commands and includes therein the process 1 (processing of the storage region X (NO OPERATION at present moment)). In the process 3, therefore, when the execution of the process of LABEL 1 is specified and the process 1 is executed, the first processing unit (1) 21 accesses the storage region X' (41) in the buffer memory 24. However, since the invalidation flag (not shown) has been set, access is directed to the storage region X of the main memory 23. At this moment, the instruction is the no-operation (NO OPERATION), and no processing is executed. The invalidation means 25" then registers NO OPERATION to the storage region X' of the buffer memory 24. Then, the successive commands of the process 3 are executed. As the execution is finished, the normal processing of the LABEL 3 is finished.

FIG. 7 illustrates the case of abnormal processing where the data stored in the buffer memory 24 is not correctly invalidated.

When the data stored in the storage region X' (40) of the buffer memory 24 is not correctly invalidated after the test data B (29) (NO OPERATION) has been stored in the storage region X of the main memory 23 by the process 2, the data in the storage region X' (40) of the buffer memory 24 remains the test data A (GO TO LABEL 1), and the invalidation flag 41' remains turned off. When the processing of the storage region X is specified in the process 3, therefore, the first processing unit (1) 21 accesses to the storage region X' of the buffer memory 24. Then, since the invalidation flag 41' remains turned off, the recurring commands (GO TO LABEL 1) in the storage region X' are executed. The time for processing the recurring commands has been set by the timer, and the processing is shifted to the LABEL 4 after the passage of the set period of time. Then, the processing operation for treating an abnormal condition i.e. abnormal process is executed at the LABEL 4 after the passage of the set period of time, and the failure of the invalidation in the buffer memory 24 is output to display.

Figure 8A:
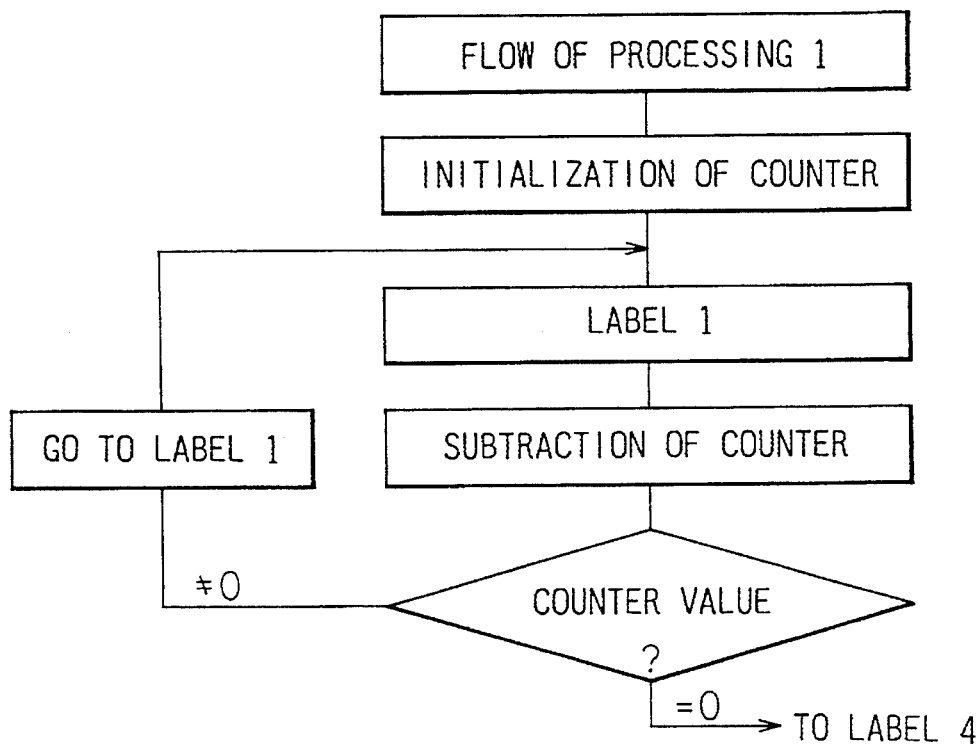
FIGS. 8 (A) and 8 (B) are diagrams illustrating a sequence of recurring commands according to the embodiment of the present invention.
Figure 8B:
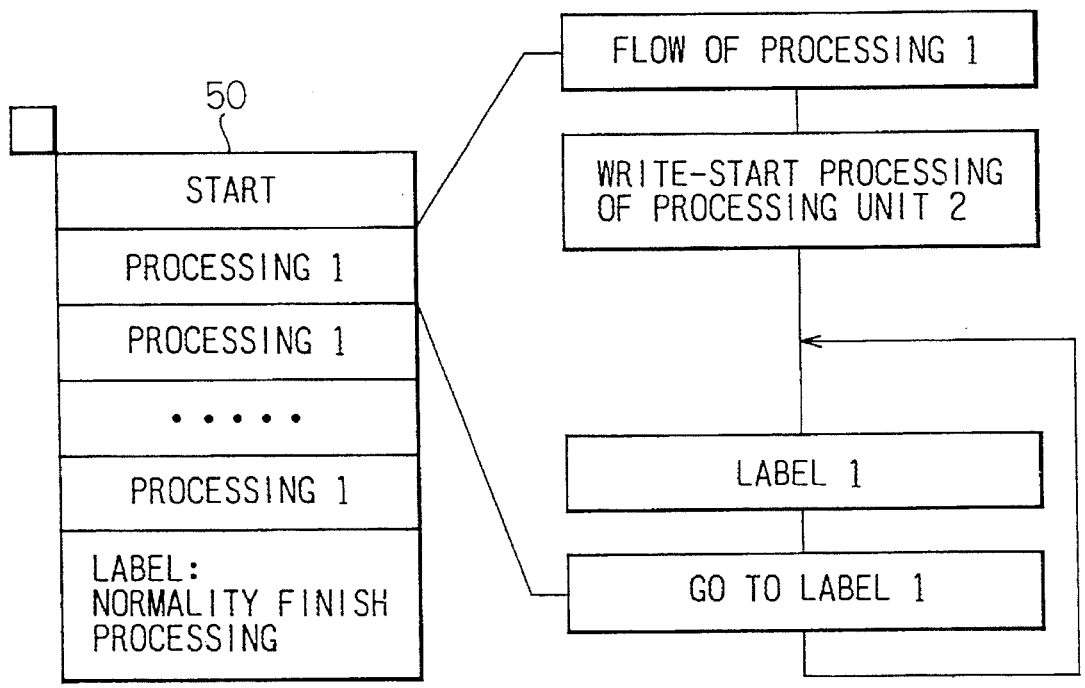
Figure 9A:
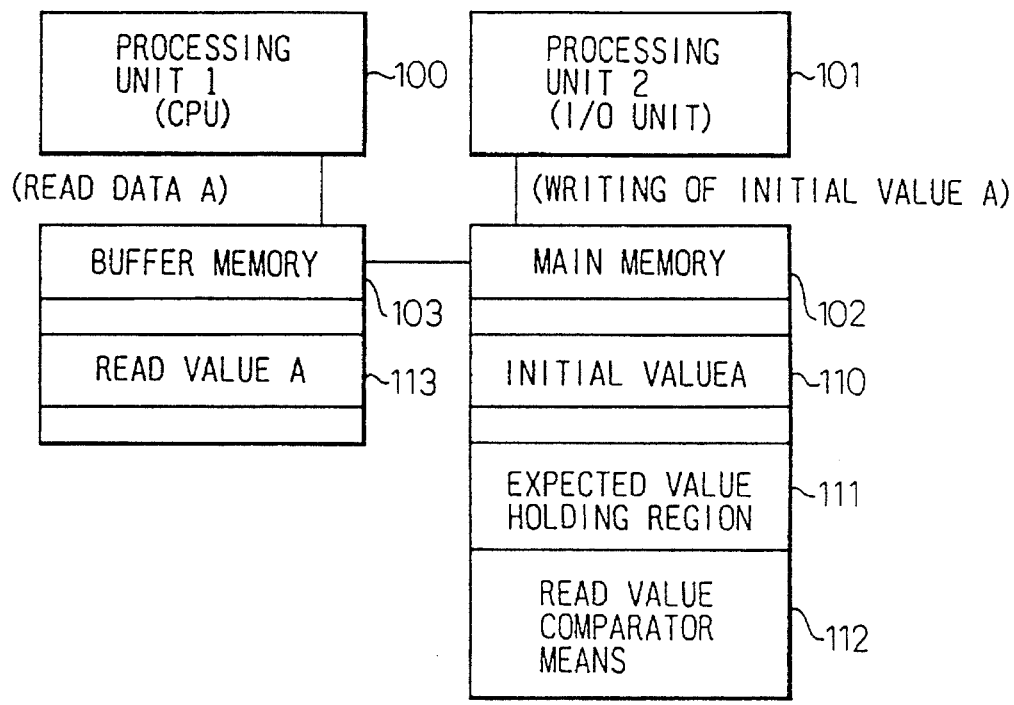
FIGS. 9 (A) to 9 (D) are diagrams illustrating procedures of a conventional method of testing the invalidation of the buffer memory.
Figure 9B:
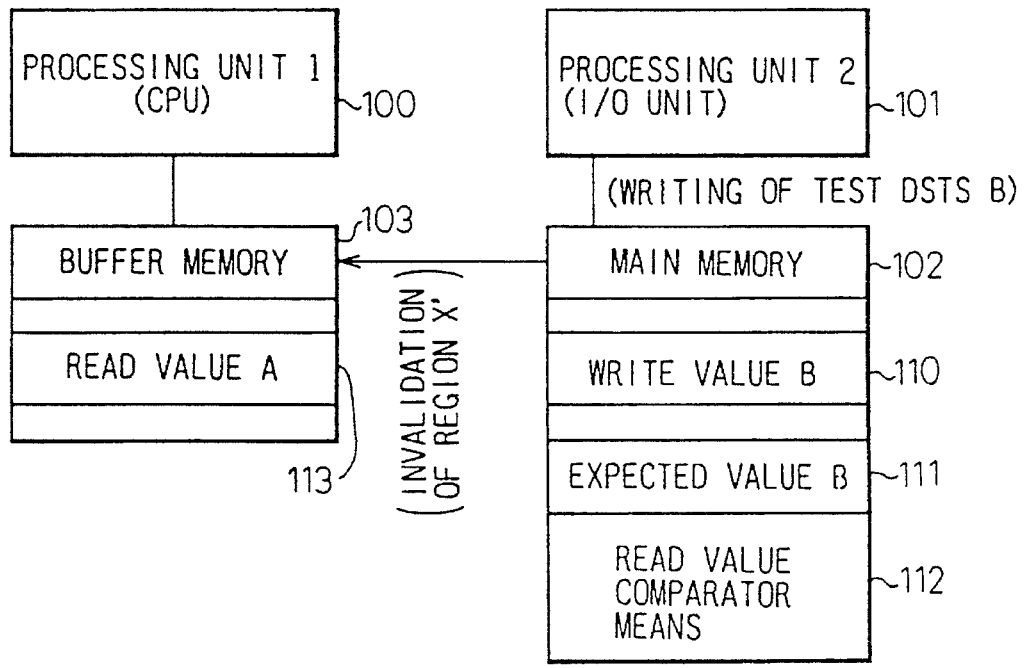
Figure 9C:
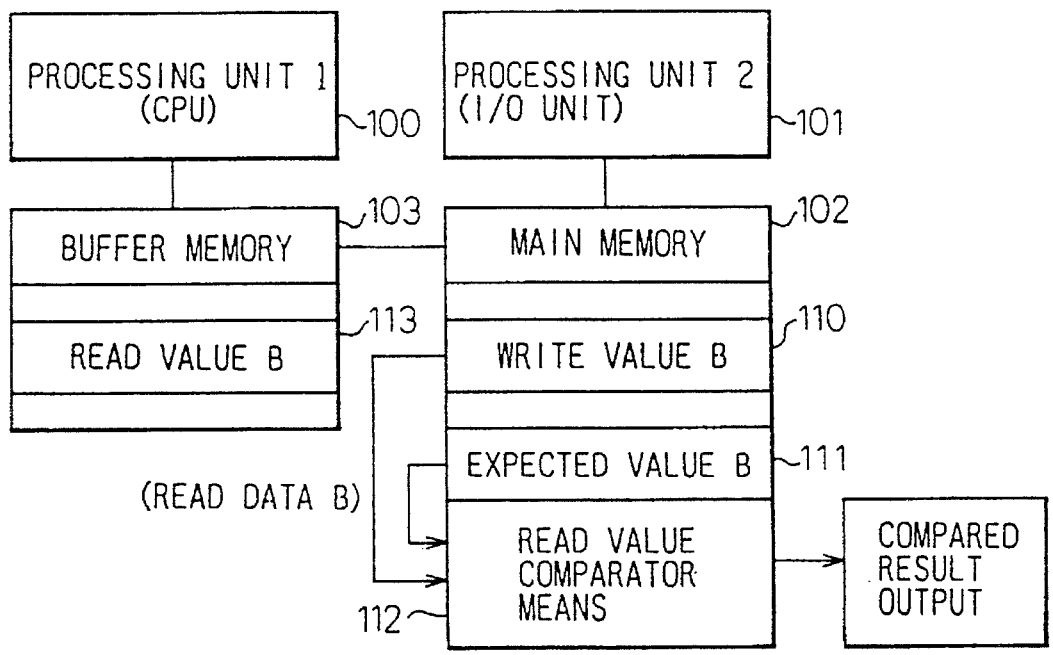
Figure 9D:
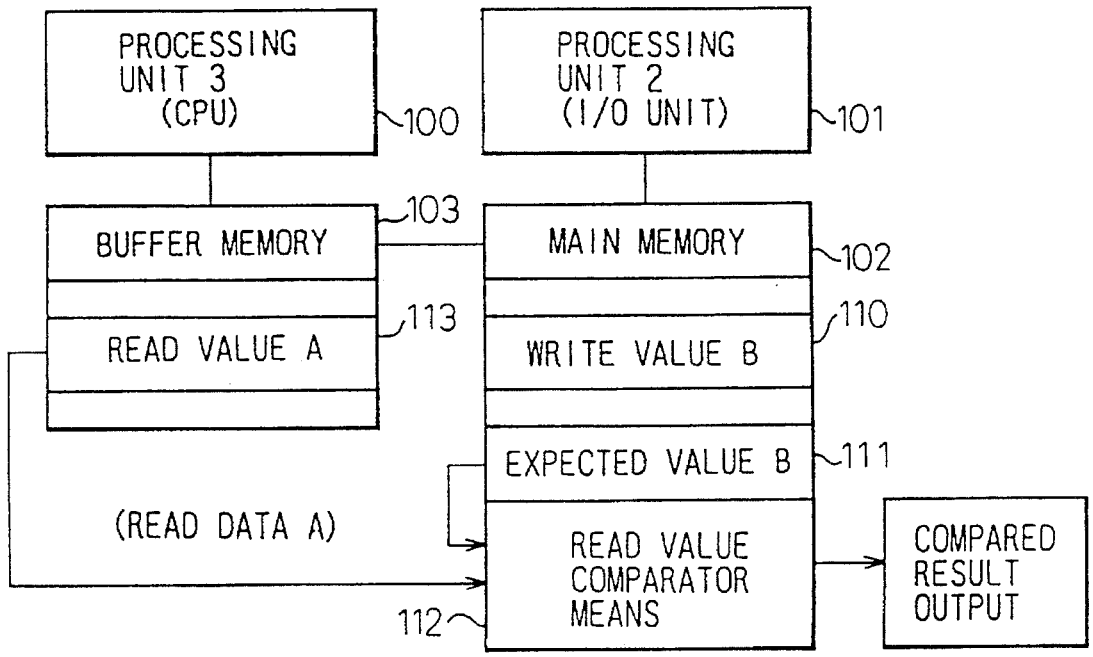

FIG. 8 illustrates a sequence of recurring commands according to the embodiment of the present invention.

FIG. 8 (A) shows the flow of process 1 (sequence of recurring commands).

The process 1 repeats the processing according to the sequence of recurring commands (GO TO LABEL 1) and subtracts the counter for every repetition. When the counter value becomes 0, the processing is shifted to the LABEL 4 (abnormal process). In the description related to FIGS. 3 to 7, the repetition of the recurring commands was finished after the passage of a preset period of time and the processing was shifted to the abnormality finish process. The subtraction counter of FIG. 8 corresponds to the timer of the embodiment of FIGS. 3 to 7.

FIG. 8 (B) illustrates the case where the whole lines (whole blocks) of the buffer memory are to be tested at one time.

In FIG. 8 (B), reference numeral 50 denotes a test program. The flow of the processing shown here includes the write start processing of the processing unit 2. Each of the processes 1 corresponds to each of the lines of the buffer memory, and the test program of the process 1 corresponds to each of the lines.

In FIG. 8 (B), the sequence of successive processing commands (no-operation command) of the second processing unit (2) 27 is stored in the specified region (storage region X) after a predetermined period of time has passed from when the write start processing was started (during a period of until the write processing is effected from when the processing unit 2 is started). Therefore, the recurring command (GO TO LABEL 1) is replaced by NO OPERATION while the recurring command (GO TO LABEL 1) is being executed.

Then, as shown in FIG. 8 (B), the flows of the processes 1 are provided corresponding to the whole lines of the memory blocks of the buffer memory and are executed, in order to test all the blocks at one time.

In putting this method into practice, when the process 1 cannot be expressed by one line size of the buffer memory, a scheduling program that corresponds to the program of the process 1 is introduced, and the read processing is repetitively executed while shifting the read position of the program with the line size as a unit. Thus, the testing is effected at one time even when the process 1 does not cover by one line size (i.e., even when the start process of the processing unit 2 is complex).

According to the device for testing the buffer memory of the present invention described above, the constituent feature resides in that the second processing unit stores the sequence of successive processing commands in the data storage region of the main memory out of synchronism with the operational processing of the first processing unit and that the second processing unit stores the sequence of successive processing commands in the data storage region of the main memory while the first processing unit is executing the sequence of the recurring commands.

Furthermore, the present invention uses the sequence of recurring commands in order to judge whether the invalidation process is normally effected or not. Here, in the device for testing the buffer memory, the feature resides in that the sequence of recurring commands is equipped with a counter or a timer which counts the command execution time or the number of times of recurring commands, and abnormal processing of the buffer memory is executed when the command execution time has reached a predetermined time or when the number of times of recurring commands has reached a predetermined number of times.

Another embodiment of the present invention is concerned with a testing method using the device for testing the buffer memory. That is, in the device for testing the buffer memory constituted as described above, said testing device being provided with a testing means stored in said main memory, a method of testing the buffer memory which comprises:

a step for storing a separately provided first command sequence in a data storage region of said main memory and, at the same time, storing said first command sequence also in a data storage region of said buffer memory in response to an instruction from said processing unit;

a step for storing a separately provided second command sequence different from said first command sequence in said data storage region of said main memory to substitute for said first command sequence in response to an instruction from a processing unit which is the same as or is different from said processing unit;

a step for invalidating the first command sequence stored in the data storage region of said buffer memory when said first command sequence in said data storage region of said main memory is rewritten; and a step for determining that the invalidation process is correctly executed when said processing unit is executing said second command sequence after said invalidation process has been executed and determining that said invalidation process is not correctly executed when said processing unit is executing said first command sequence.

The present invention requires neither a holding means for holding an expected value data for judging the result of testing nor a comparator means for comparing the expected value data with the read data. Therefore, the testing is effected using a reduced amount of hardware resources and the testing time can also be shortened. Moreover, the invalidation of the buffer memory for commands can be tested even in systems in which a buffer memory for commands and a buffer memory for operands exist independently of each other.

I claim:

1. An apparatus for testing a buffer memory device comprising:

a main memory storing predetermined operational processing data;

a buffer memory holding a copy of said predetermined operational processing data stored in said main memory;

at least one processing unit which accesses at least one of said main memory and said buffer memory;

invalidation means for rewriting said operational processing data in said main memory and for invalidating said operational processing data stored in said buffer memory when said operational processing data stored in said buffer memory are different from said operational processing data stored in said main memory; and means for testing the buffer memory device, stored in said main memory, said testing means comprising:

means for storing a separately provided first command sequence in a data storage region of said main memory and, at the same time, storing said first command sequence also in a data storage region of said buffer memory in response to an instruction from said processing unit;

means for storing a separately provided second command sequence different from said first command sequence in said data storage region of said main memory to substitute for said first command sequence in response to an instruction from a processing unit which is the same as or is different from said processing unit;

means for invalidating the first command sequence stored in the data storage region of said buffer memory, when said first command sequence in said data storage region of said main memory is rewritten; and means for determining that the invalidation processing operation is carried out when said processing unit is executing said second command sequence after said invalidation processing has been executed and for determining that said invalidation processing is not correctly executed when said processing unit is executing said first command sequence.

2. An apparatus for testing a buffer memory device according to claim 1, wherein when said processing units are provided in a plural number, each processing unit has means for executing a command sequence different from those executed by the other processing units and out of synchronism therewith.

3. An apparatus for testing a buffer memory device according to claim 1, wherein said first command sequence is a sequence of recurring commands.

4. An apparatus for testing a buffer memory device according to claim 1, wherein said second command sequence is a sequence of successive processing commands.

5. An apparatus for testing a buffer memory device according to claim 2, wherein said processing units include a first processing unit having means for accessing both said main memory and said buffer memory, and a second processing unit having means for accessing said buffer memory.

6. An apparatus for testing a buffer memory device according to claim 5, wherein said second processing unit stores said sequence of successive processing commands in the data storage region of said main memory.

7. An apparatus for testing a buffer memory device according to claim 5, wherein said first processing unit stores said sequence of recurring commands in the data storage region of said main memory.

8. An apparatus for testing a buffer memory device according to claim 5, wherein said second processing unit stores said sequence of successive processing commands in the data storage region of said main memory which is carried out in synchronism with the operational processing of said first processing unit.

9. An apparatus for testing a buffer memory device according to claim 8, wherein said second processing unit stores said sequence of successive processing commands in the data storage region of said main storage unit while said first processing unit is executing said sequence of recurring commands.

10. An apparatus for testing a buffer memory device according to claim 3, wherein said sequence of recurring commands is equipped with a counter or a timer which counts the command execution time or the number of times the commands recur, and abnormality processing of said buffer memory is executed when said command execution time has reached a predetermined time or when said number of times of recurring commands has reached a predetermined number.

11. An apparatus for testing a buffer memory device according to claim 1, wherein said testing means is provided for each of a plurality of data storage region units in said buffer memory.

12. A method for testing a buffer memory device comprising:

storing predetermined operational processing data in a main memory;

holding a copy of said predetermined operational processing data, which is stored in said main memory, in a buffer memory;

accessing at least one of said main memory and said buffer memory by way of at least one processing unit;

rewriting said operational processing data in said main memory into different operational processing data when said processing unit is operated, and invalidating said operational processing data stored in said buffer memory;

storing a separately provided first command sequence in a data storage region of said main memory and, at the same time, storing said first command sequence also in a data storage region of said buffer memory in response to an instruction from said processing unit;

storing a separately provided second command sequence different from said first command sequence in said data storage region of said main memory to substitute for said first command sequence in response to an instruction from a processing unit which is the same as or is different from said processing unit;

invalidating the first command sequence stored in the data storage region of said buffer memory when said first command sequence in said data storage region of said main memory is rewritten; and judging that the invalidation processing is correctly executed when said processing unit is executing said second command sequence after said invalidation processing has been executed and judging that said invalidation processing is not incorrectly executed when said processing unit is executing said first command sequence.

13. An apparatus for testing a buffer memory device, comprising:

a main memory storing predetermined operational processing data;

a buffer memory for storing a copy of said predetermined operational processing data stored in said main memory;

processing units, including first and second processing units, accessing at least one of said main memory and said buffer memory;

invalidation means for rewriting said operational processing data in said main memory into different operational processing data when at least one processing is operated, and for invalidating said operational processing data stored in said buffer memory when said operational processing data stored in said buffer memory are different from said operational processing data stored in said main memory; and means, stored in said main memory, for testing said buffer memory device, said testing means comprising:

means for storing a separately provided first command sequence in a data storage region of said main memory, and storing said first command sequence in a data storage region of said buffer memory in response to an instruction from said first processing unit, means for storing a separately provided second command sequence different from said first command sequence in said data storage region of said main memory in place of said first command sequence in response to an instruction from one of said first and second processing units, means for invalidating the first command sequence stored in the data storage region of said buffer memory, when said second command sequence is substituted for said first command sequence in said data storage region of said main memory, and means for determining that the invalidation processing is correctly executed when said first processing unit is executing said second command sequence after said invalidation processing has been executed, and for determining that said invalidation processing is not correctly executed when said first processing unit is executing said first command sequence.

14. An apparatus for testing a buffer memory device, comprising:

a main memory storing predetermined operational processing data;

a buffer memory for storing a copy of said predetermined operational processing data stored in said main memory;

processing units, including first and second processing units, accessing at least one of said main memory and said buffer memory;

invalidation means for rewriting said operational processing data in said main memory into different operational processing data when at least one processing is operated, and for invalidating said operational processing data stored in said buffer memory when said operational processing data stored in said buffer memory are different from said operational processing data stored in said main memory; and means, stored in said main memory, for determining whether the invalidation processing was executed properly.

15. A method for testing a buffer memory device comprising:

storing a first command sequence in a data storage region in a main memory;

storing said first command sequence in a data storage region of a buffer memory in response to an instruction from a processing unit;

storing a separately provided second command sequence different from said first command sequence in said data storage region of said main memory to substitute for said first command sequence in response to an instruction from one of processing units;

invalidating the first command sequence stored in the data storage region of said buffer memory when first command sequence in said storage region of said main memory is rewritten by way of an invalidation process;

judging that the invalidation process is correctly executed when said processing unit is executing said second command sequence after said invalidation processing has been executed; and judging that said invalidation processing is incorrectly normally executed when said processing unit is executing said first command sequence.

16. An apparatus for testing a buffer memory device according to claim 4, wherein said sequence of recurring commands is equipped with a counter or a timer which counts the command execution time or the number of times the commands recur, and abnormality processing of said buffer memory is executed when said command execution time has reached a predetermined time or when said number of times of recurring commands has reached a predetermined number.

* * * * *

UNITED STATES PATENT AND TRADEMARK OFFICE
CERTIFICATE OF CORRECTION

PATENT NO. : 5,463,637
DATED : Oct. 31, 1995
INVENTOR(S) : HAYASHI

It is certified that error appears in the above-indentified patent and that said Letters Patent is hereby corrected as shown below:

Col. 3, line 4, delete "the main memory";
line 18, after "device" insert --,--.

Signed and Sealed this

Sixteenth Day of January, 1996

BRUCE LEHMAN

Attest:

Attesting Officer

Commissioner of Patents and Trademarks